US010104813B2

(12) United States Patent
Cheng et al.

(10) Patent No.: US 10,104,813 B2
(45) Date of Patent: Oct. 16, 2018

(54) POWER CIRCUIT MODULE

(71) Applicant: DELTA ELECTRONICS, INC., Taoyuan (CN)

(72) Inventors: Wei Cheng, Taoyuan (CN); Shouyu Hong, Taoyuan (CN); Zhenqing Zhao, Taoyuan (CN); Tao Wang, Taoyuan (CN)

(73) Assignee: Delta Electronics, Inc., Taoyuan (TW)

(*) Notice: Subject to any disclaimer, the term of this patent is extended or adjusted under 35 U.S.C. 154(b) by 0 days.

(21) Appl. No.: 15/165,273

(22) Filed: May 26, 2016

(65) Prior Publication Data

US 2016/0352244 A1   Dec. 1, 2016

(30) Foreign Application Priority Data

May 28, 2015   (CN) .......................... 2015 1 0282388

(51) Int. Cl.
*H05K 7/20* (2006.01)
*H01L 23/373* (2006.01)
(Continued)

(52) U.S. Cl.
CPC ........... *H05K 7/209* (2013.01); *H01L 23/053* (2013.01); *H01L 23/3735* (2013.01);
(Continued)

(58) Field of Classification Search
CPC . G06F 1/181–1/182; H05K 7/20218–7/20381;
(Continued)

(56) References Cited

U.S. PATENT DOCUMENTS

| 4,804,130 A | 2/1989 | Kwan et al. |
| 5,278,447 A | 1/1994 | Vongfuangfoo et al. |

(Continued)

FOREIGN PATENT DOCUMENTS

| CN | 101350334 A | 1/2009 |
| CN | 101681907 A | 3/2010 |

(Continued)

OTHER PUBLICATIONS

The 1st OA issued in the counterpart Taiwan application dated Apr. 28, 2017, by the TIPO.

(Continued)

*Primary Examiner* — Anthony Haughton
*Assistant Examiner* — Razmeen Gafur
(74) *Attorney, Agent, or Firm* — Yunling Ren (57) ABSTRACT

A power circuit module is provided. The encapsulated power circuit module comprises: a pressure plate comprising a protrusion body; a frame; and a substrate bearing a power circuit, the power circuit comprising at least a power switching device; the frame is provided between the substrate and the pressure plate, the frame supports the pressure plate, and a substantially closed space is formed by the substrate, the pressure plate and the frame; and when an external force is applied on the pressure plate, the protrusion body press against the substrate and is in insulation contact with the substrate, and the external force is transmitted evenly on the substrate.

15 Claims, 13 Drawing Sheets

(51) Int. Cl.
   *H01L 23/40* (2006.01)
   *H01L 23/498* (2006.01)
   *H05K 1/02* (2006.01)
   *H01L 23/053* (2006.01)
   *H01L 23/473* (2006.01)
   *H01L 23/24* (2006.01)

(52) U.S. Cl.
   CPC .... *H01L 23/4006* (2013.01); *H01L 23/49811* (2013.01); *H05K 1/0204* (2013.01); *H05K 1/0209* (2013.01); *H05K 1/0271* (2013.01); H01L 23/24 (2013.01); H01L 2224/32225 (2013.01); H01L 2224/4846 (2013.01); H01L 2224/48139 (2013.01); H01L 2224/48227 (2013.01); H01L 2224/73265 (2013.01); H05K 2201/066 (2013.01); H05K 2201/10053 (2013.01); H05K 2201/10166 (2013.01); H05K 2201/10409 (2013.01); H05K 2201/2018 (2013.01)

(58) Field of Classification Search
   CPC ............... H05K 7/20409–7/20418; H05K 7/20009–7/202; H01L 23/367–23/3677; H01L 23/473; H01L 23/46–23/467
   USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
   See application file for complete search history.

(56) References Cited

U.S. PATENT DOCUMENTS

| | | | |
|---|---|---|---|
| 5,302,891 A | 4/1994 | Wood et al. | |
| 5,541,525 A | 7/1996 | Wood et al. | |
| 2002/0005341 A1* | 1/2002 | Seki | H01H 59/0009 200/181 |
| 2002/0135981 A1* | 9/2002 | Pautsch | H01L 23/4735 361/700 |
| 2006/0120047 A1* | 6/2006 | Inoue | H01L 23/4006 361/699 |
| 2007/0133180 A1* | 6/2007 | Nilson | H05K 7/209 361/720 |
| 2008/0101032 A1* | 5/2008 | Tschirbs | H01L 23/4006 361/719 |
| 2009/0213553 A1* | 8/2009 | Tschirbs | H01L 23/053 361/709 |
| 2009/0242242 A1* | 10/2009 | Ishii | H05K 3/326 174/254 |
| 2010/0091464 A1* | 4/2010 | Ohnishi | H01L 23/053 361/723 |
| 2010/0254089 A1* | 10/2010 | Anderl | H01L 23/4093 361/702 |
| 2010/0325882 A1* | 12/2010 | DBbene, II | G06F 1/18 29/829 |
| 2011/0044001 A1* | 2/2011 | Olesen | H01L 23/473 361/703 |
| 2011/0141690 A1* | 6/2011 | Le | H01L 23/4735 361/689 |
| 2013/0176679 A1* | 7/2013 | Anderl | H01L 23/4093 361/679.47 |
| 2013/0194853 A1* | 8/2013 | Tokuyama | H01L 23/36 363/131 |
| 2013/0208422 A1* | 8/2013 | Hughes | H05K 7/20445 361/700 |
| 2014/0043765 A1* | 2/2014 | Gohara | H01L 23/3735 361/699 |
| 2014/0160822 A1* | 6/2014 | Kuwano | H02M 7/003 363/141 |
| 2014/0335706 A1* | 11/2014 | Fan | H01R 12/718 439/82 |
| 2015/0109738 A1* | 4/2015 | Yamada | H01L 23/4334 361/717 |
| 2015/0116945 A1* | 4/2015 | Minamio | H01L 23/4006 361/709 |
| 2015/0189794 A1* | 7/2015 | Tashima | B62D 5/0406 180/446 |
| 2015/0216089 A1* | 7/2015 | Tanaka | H05K 7/209 361/699 |
| 2015/0245523 A1* | 8/2015 | Takagi | H02M 7/003 361/715 |
| 2015/0250074 A1* | 9/2015 | Matsumoto | H05K 7/20936 361/696 |
| 2015/0289411 A1* | 10/2015 | Kamiya | H05K 7/20927 361/701 |
| 2015/0296661 A1* | 10/2015 | Mari Curbelo | H01L 23/427 361/700 |
| 2015/0325494 A1* | 11/2015 | Kroneder | H01L 23/4006 361/715 |
| 2015/0327403 A1* | 11/2015 | Naoe | H01L 23/36 361/711 |
| 2016/0178460 A1* | 6/2016 | Ogura | G01L 9/0072 73/862.626 |
| 2016/0233411 A1* | 8/2016 | Kim | B06B 1/0644 |

FOREIGN PATENT DOCUMENTS

| | | |
|---|---|---|
| CN | 102522390 A | 6/2012 |
| CN | 102665374 A | 9/2012 |
| CN | 103779313 A | 5/2014 |
| TW | I241870 B | 10/2005 |
| TW | 200729900 A | 8/2007 |
| TW | M370247 U1 | 12/2009 |
| TW | M498009 U | 4/2015 |

OTHER PUBLICATIONS

The corresponding Chinese 1st OA issued by SIPO dated May 4, 2018.

\* cited by examiner

POWER CIRCUIT MODULE

CROSS REFERENCE TO RELATED APPLICATION

This application is based on and claims priority to Chinese Patent Application No. 201510282388.3, filed on May 28, 2015, the entire contents of which are incorporated herein by reference.

TECHNICAL FIELD

The present disclosure relates to a power circuit, and more particularly, to an assembly structure of a power circuit module.

BACKGROUND

Power circuit modules are commonly used in power conversion circuits. A power circuit module, which is typically a complete power circuit, can usually be used for conversion of DC/DC or AC/DC. The power circuit is generally provided therein with at least a power switching device that is also known as a switch in the art. Conversion of power supply is achieved by controlling the power switching device with a controller.

In general, power circuit modules with different power levels differ from each other in size and, thus in different packaging type. A power circuit module for a higher power application is typically larger in size. Accordingly, as being applied to a system board, the power circuit module of a relatively higher power is usually required to be provided with a heat radiator.

A power circuit module is usually applied to the system board in a certain packaging type. The power circuit module may typically include a substrate, a plastic housing for encapsulating the substrate, and a heat radiator for dissipating heat from the substrate. The packaging structure for different type of substrates should be different from each other slightly. A typical power circuit module without copper base plate is taken as an example for illustrating the packaging structure.

Power switching devices and corresponding circuits with control devices are placed on the substrate, and interconnections for the devices on the substrate are achieved by soldering and wire bonding. A packaging housing corresponding to the substrate includes a frame, a connection plate, a cushion pad and a pressure plate. The substrate is arranged in a sealed space formed by the connection plate and the frame. The connection plate includes a plate body, a bridge element and a gate signal terminal, and the bridge element and the gate signal terminal are located at the edging area of the plate body. When the connection plate is assembled together with the substrate and the frame, leading-out terminals are achieved by the bridge element and the gate signal terminal for connecting the power circuit on the substrate with an external system board. Heat generated by the power switching devices is dissipated through the heat radiator. The pressure plate, the cushion pad and the bridge element are required to achieve uniform pressure between the substrate and the heat radiator, for the further purpose of obtaining good contact between them. In an example, the cushion pad is sandwiched between the pressure plate and the bridge element. Pressure is evenly applied on the bridge element via the cushion pad, provided by the pressure plate fastened by screws onto the heat radiator, and then applied evenly on the substrate through pressure points of the bridge element, so as to enable the good contact between the substrate and the heat radiator. The thermal silicone grease is applied on the contact surface of the substrate and the heat radiator, such that a thermal resistance between the power module and the heat radiator can be reduced. Moreover, sealing materials are applied and cured between the substrate and the frame to forming the sealed space, with some encapsulation material filled in to protect the devices on the substrate, as the performances of the devices are easily be impacted by the external environment.

As can be seen from above, the typical power circuit module of higher power requires a relatively complex assembly due to its complicated structure, and it is difficult to reduce production cost.

The foregoing information is merely disclosed to facilitate understanding of background of the present disclosure. Therefore, the foregoing information may include information not constituting the prior art known to those of ordinary skill in the art.

SUMMARY

In view of above, there is provided an assembly structure and a simple assembly process of a power circuit module according to the present disclosure.

Additional aspects and advantages of the present disclosure will be illustrated and become apparent, at least in part, through the description or may be obtained through implementation of the present disclosure.

There is provided a power circuit module according to the present disclosure, including: a pressure plate comprising a protrusion body; a frame; and a substrate bearing a power circuit, the power circuit including at least a power switching device; wherein the frame is disposed between the substrate and the pressure plate, the frame supports the pressure plate, and a substantially closed space is formed by the substrate, the pressure plate and the frame; and when an external force is applied on the pressure plate, the protrusion body press against the substrate and is in insulation contact with the substrate, and the external force is transmitted to the substrate via the protrusion.

According to the power circuit module provided by the present disclosure, as pressure is applied on the pressure plate, the pressure transmitted to the substrate via the protrusion body of the pressure plate can be distributed more evenly due to buffering deformation of materials with different elastic modulus inside the pressure plate. In this way, the risk to damage the substrate due to concentrated stress directed applied on the substrate can be reduced, assembly process of the power circuit module could be simplified, efficiency of the assembly can be improved, and cost of the power circuit module can be reduced.

BRIEF DESCRIPTION OF THE DRAWINGS

By referring to detailed description of the drawings and exemplary embodiments, the foregoing and other characteristics and advantages of the present disclosure will become more apparent.

DETAILED DESCRIPTION

Exemplary embodiments will be described more comprehensively by referring to accompanying drawings. However, exemplary embodiments can be implemented in many forms. It shall not be understood that the present disclosure is limited to embodiments as set forth herein; instead, these embodiments are provided to ensure the present disclosure to be more comprehensive and complete. And the conception of these exemplary embodiments shall be conveyed to those skilled in the art across-the-board. In the drawings, thickness of areas and layers is exaggerated for distinctness. The same numbers in drawings represent the same or similar structures, and thus detailed description thereof may be omitted.

Characteristics, structures or features as described may be incorporated into one or more embodiments in any suitable way. Many concrete details are provided in the following descriptions for a full understanding of embodiments of the present disclosure. However, those skilled in the art should realize that the technical solution of the present disclosure may be implemented without one or even more of specific details, and/or by using other alternative methods, components, materials and the like. In other circumstances, known structures, materials or operations are not shown or described in detail for the avoidance of fuzziness of various aspects of the present disclosure.

Figure 1A:
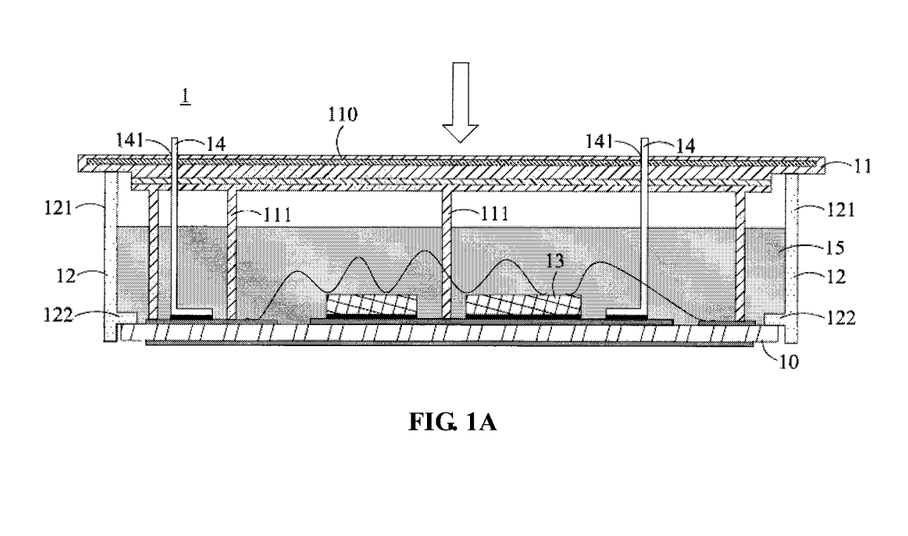
FIGS. 1A and 1B are schematic diagrams illustrating a power circuit module according to an embodiment of the disclosure.
Figure 1B:
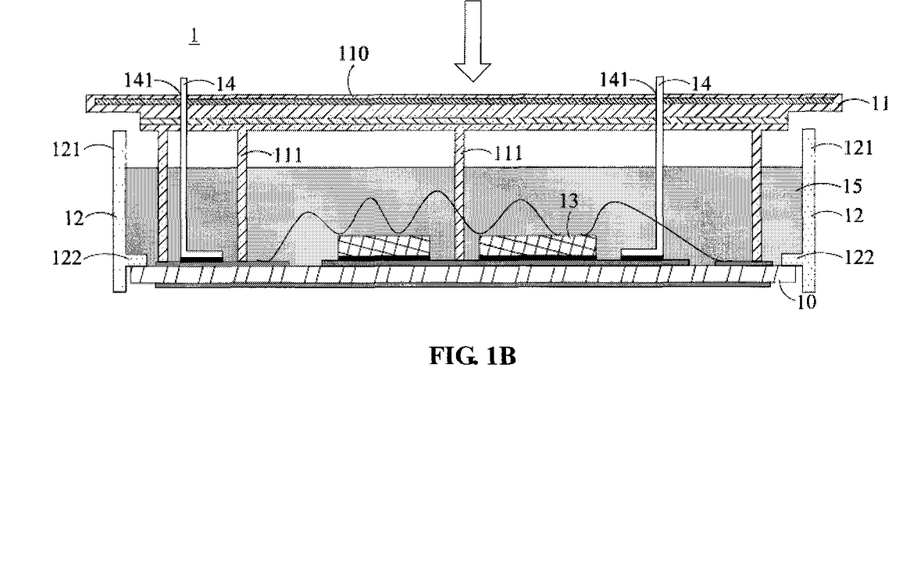

FIGS. 1A and 1B are schematic diagrams illustrating a power circuit module according to an embodiment of the disclosure. As shown in FIG. 1A, the power circuit module 1 according to the embodiment of the disclosure includes a substrate 10, a pressure plate 11, a frame 12 and a power switching device 13.

In an embodiment, the substrate 10 includes a first surface and a second surface opposite and parallel to each other. A circuit pattern is formed on the first surface supporting a power circuit in the power circuit module 1. The power circuit module 1 is generally suitable for power circuits having power no less than 50 kilowatt, but the present disclosure is not limited thereto. The power circuit comprises at least a power switching device 13. The power switching device 13 may be fixed on the first surface of the substrate 10 via materials such as solder. Surface electrodes on a top surface of the power switching device 13 may be connected with the circuit pattern on the first surface of the substrate via conductive material (e.g. bonding wire or copper sheet) so as to enable internal electrical connection of the power circuit module 1. Furthermore, external electrical connection for the power circuit module 1 can be achieved by fixing and electrically connecting terminals 14, through a process such as soldering and ECA (Electrically Conductive Adhesives), to the first surface of the substrate 10. Moreover, the power switching device 13 can be also electrically coupled with the substrate 10 by means of flip chip and so on, and the present disclosure is not limited thereto.

For example, the substrate 10 is a DBC (Direct Bonding Copper) substrate, a DBA (Direct Bonding Aluminum) substrate, an LTCC (Low-Temperature Co-fired Ceramic) substrate, a DPC (Direct Plated Copper) substrate, an IMS (Insulate Metal Substrate) substrate, a PCB (Printed Circuit Board) or the like. The present disclosure is not limited thereto.

The pressure plate 11 contains at least two kinds of material having different elastic modulus, that is, a first material having lower elastic modulus and a second material having higher elastic modulus. The pressure plate 11 includes a main body 110 and at least one protrusion body 111. The main body 110 is a flat plate substantially parallel to the substrate 10. The protrusion body 111 is perpendicular to the main body 110 and provided on one side of the main body 110 facing toward the substrate 10. The main body 110 and the protrusion body 111 may be molded in one piece. In an embodiment, the protrusion body 111 is in insulated direct contact with the first surface of the substrate 10, such that pressure applied on the main body 110 can be transmitted more evenly to the substrate 10 via the protrusion body 111. Moreover, the main body 110 is provided thereon with terminal holes 141 corresponding to the terminals 14 for facilitating the terminals 14 to pass through the pressure plate 11. The pressure plate 11 can be manufactured by double-shot or multi-shot injection molding process and manufactured in batch with a double-shot injection molding machine or a multi-shot injection molding machine.

The frame 12 is located between the substrate 10 and the pressure plate 11 and serves to bear the pressure plate 11, such that the pressure plate 11 can be restricted in movement and structurally supported, transmission for part of pressure on the pressure plate 11 can be distributed properly, and height consistency of the power circuit module 1 can be also controlled. In some embodiments, for example, as shown in FIG. 1A illustrating the frame 12 at the side of the substrate 10, the frame 12 includes a supporting part 121 and a limiting part 122. The pressure plate 11 is supported by the supporting part 121 and the substrate 10 is surrounded by the same. The limiting part 122 is perpendicular to the supporting part 121 and clipped on the first surface of the substrate 10, such that movement of the substrate 10 can be restricted. Moreover, a substantially closed space is formed by the frame 12, the main body 110 and the substrate 10. The substantially closed space formed by the frame 12 and the main body 110 may be fully or partially filled with encapsulation material 15, which also may encapsulate the protrusion body 111 therein, for purpose of protection, since the power switching device 13 is vulnerable to humidity, ion, dust and the like. The main body 110 of the pressure plate 11 may be provided thereon with inflow holes (not illustrated in the drawing) such that the encapsulation material 15 can be injected into the substantially closed space shown in FIG. 1A.

In an embodiment as shown in FIG. 1B, however, the support part 121 of the frame 12 is separated from the pressure plate 11 by a certain distance instead of being in contact with it. The pressure plate 11 can be supported by its protrusion body 111 and the frame 12 can be supported by the limiting part 122 thereof. Thus, with non-contact relation between the pressure plate 11 and the frame 12, they can be combined by assembling members such as a screw and a screw hole. In this way, a non-completely closed space is formed by the pressure plate 11, the frame 12 and the substrate 10.

Figure 2A:
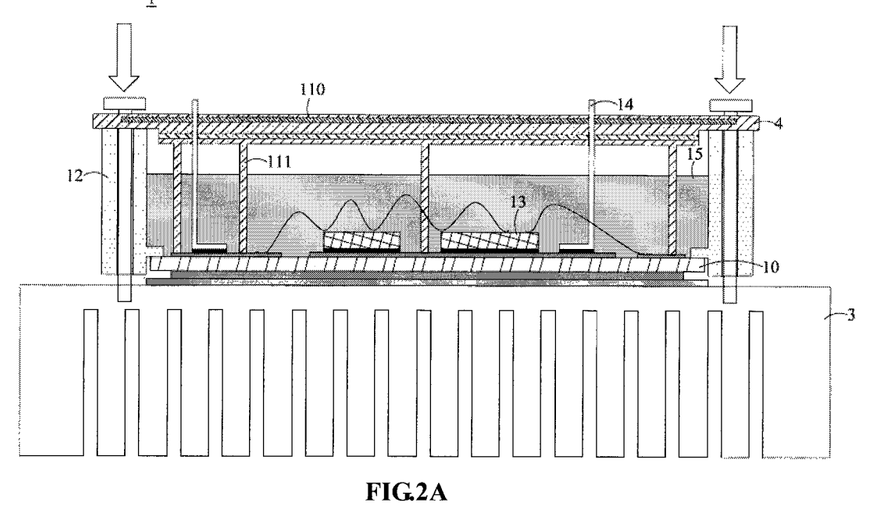
FIGS. 2A-2C are schematic diagrams illustrating an assembly of the power circuit module and a heat radiator according to an embodiment of the disclosure.
Figure 2B:
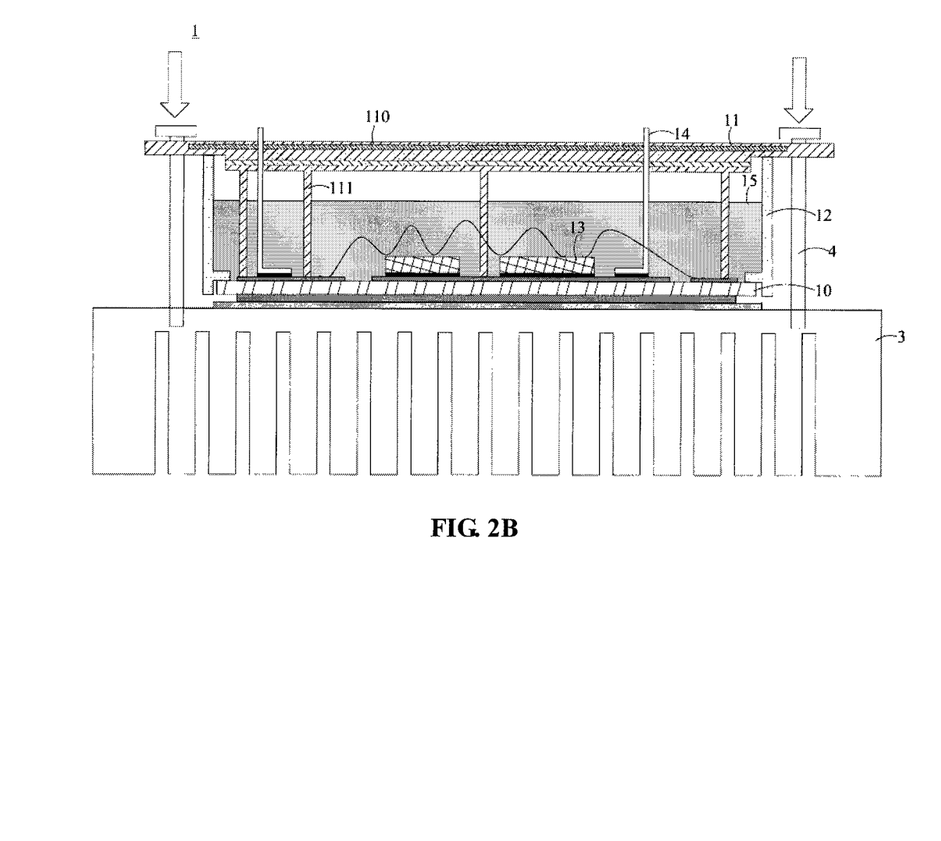
Figure 2C:
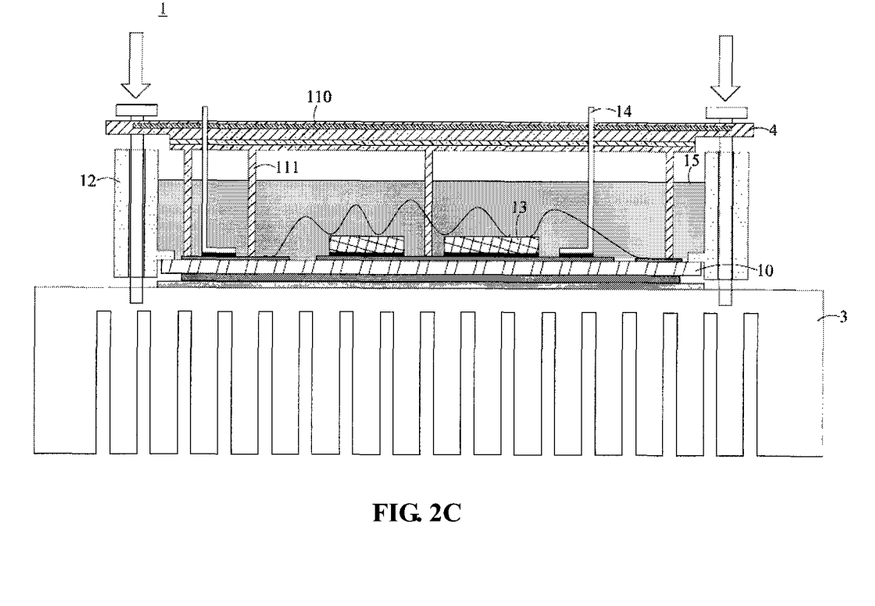

FIGS. 2A-2C are schematic diagrams illustrating an assembly of the power circuit module 1 and the heat radiator 3 according to an embodiment of the disclosure. The heat radiator 3 is connected with a surface of the substrate opposite to the surface thereof bearing the power switching device 13. One end of the frame 12 is connected with the pressure plate 11, and the other end thereof is connected with the heat radiator 3. The pressure applied on the pressure plate 11 may be provided by pretightening force of a fastening part 4 (e.g. a screw) for fastening the power circuit module 1. As shown in FIG. 2A, the fastening part 4 penetrates through frame body of the frame 12 such that the power circuit module 1 can be fixed to the heat radiator 3. When the fastening part 4 is a screw, a thread structure in the frame body of the frame 12 is provided to match with the fastening part 4. As shown in FIG. 2B, the fastening part 4 is located outside the frame 12 and fixed to the heat radiator 3 after passing through the pressure plate 11.

FIG. 2C illustrates an assembly of the pressure plate 11 and the frame 12 with non-contact relation therebetween. As same as the embodiment shown in FIG. 1B, the supporting part 121 of the frame 12 is separated from the pressure plate 11 by a certain distance instead of being in contact with it. The pressure plate 11 can be supported by the protrusion body 111 and the frame 12 can be supported by the limiting part 122 thereof. The fastening part 4 penetrates frame body of the frame 12 such that the power circuit module 1 can be fixed to the heat radiator 3.

According to the power circuit module provided by the present disclosure, as pressure is applied on the pressure plate, the pressure transmitted to the substrate via the protrusion body of the pressure plate can be distributed more evenly due to buffering deformation of the first elastic material having lower elastic modulus inside the pressure plate. In this way, risk for damage of the substrate due to concentrate stress can be reduced, reliability can be improved, structural cost of the power circuit module can be lowered, and assembly process thereof can be simplified.

As mentioned in the above embodiments, the pressure plate 11 contains the first material having the first elastic modulus for purpose of buffering pressure applied on the pressure plate. The first material is a kind of material with low elastic modulus. The material with low elastic modulus is adopted as it presents a relatively great buffering effect. Thus, when the pressure is applied on the pressure plate 11, deformation of the pressure plate 11 along a direction of the pressure is relatively large. In this way, the pressure applied on the pressure plate can be relieved preferably due to deformation of the first material, and can be transmitted to the substrate 10 more evenly such that the risk for damage of the substrate due to concentrate stress can be reduced. Moreover, the substrate 10 could have a good contact with the heat radiator 3 by transmitting the external pressure to the substrate through the pressure plate, so as to facilitate uniform thermal resistance of the power circuit module 1. The material with low elastic modulus can be selected as material with elastic modulus less than 500 Mpa according to the pressure, an area of thrust surface of the substrate 10, and requirement for the deformation magnitude of the pressure plate 11. For example, the material with low elastic modulus may be selected from TPR (Thermoplastic Rubber), TPE (Thermoplastic Elastomer) or the like, for example, TPE with elastic modulus at about 200 Mpa.

In addition, the pressure plate 11 further contains at least a second material having a second elastic modulus which may be normal structural material, for example, nonmetallic materials such as polycarbonate, nylon, polypropylene and the like, or metallic or metal alloy materials such as aluminum, copper, steel, stainless steel and the like. Alternatively, for ease of manufacturing and molding the pressure plate, the second material having the second elastic modulus may be a kind of thermoplastic insulated material. The second material having the second elastic modulus contributes to improve strengthen of the pressure plate 11, such that the deformation of the pressure plate 11 due to deformation of the first material therein is prevented from being too significant, and thus elastic deformation of the whole pressure plate 11 under the pressure can be controlled within an expected design range. In an embodiment, the elastic modulus of the second material is no less than twice the elastic modulus of the first material.

Figure 3A:
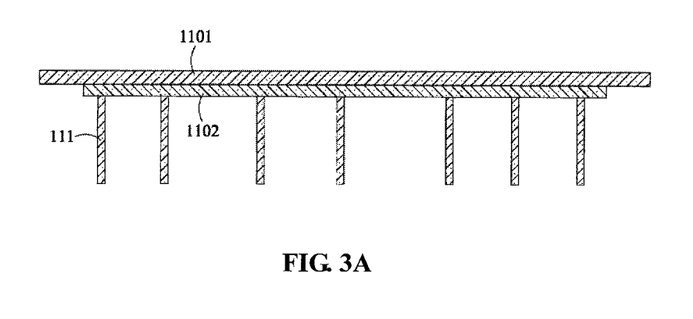
FIGS. 3A-3F are schematic diagrams illustrating a pressure plate in different structures respectively in the power circuit module according to embodiments of the disclosure.
Figure 3B:
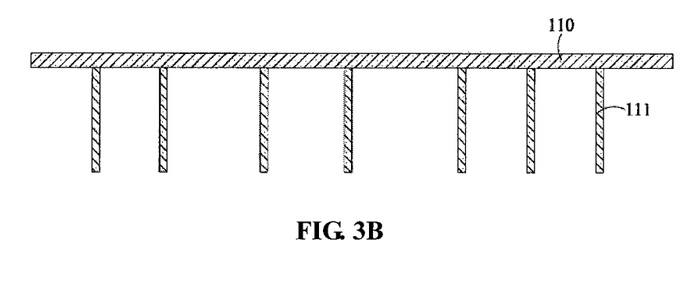
Figure 3C:
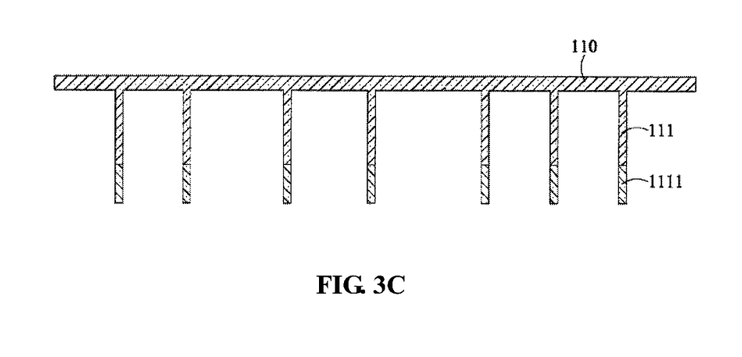
Figure 3D:
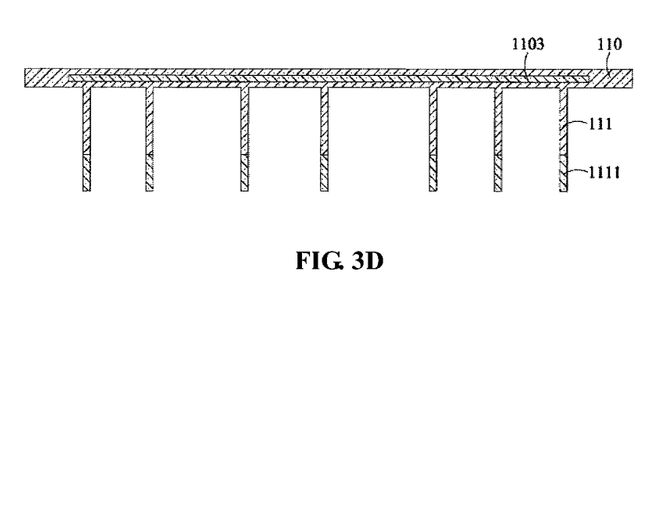

FIGS. 3A-3F are schematic diagrams illustrating a pressure plate in the power circuit module according to embodiments of the disclosure. In the embodiment of the pressure plate as shown in FIG. 3A, the main body 110 includes an upper part 1101 and a lower part 1102. Herein, the lower part 1102 is made from the first material having the first elastic material to serve function of pressure buffering for the main body 110. In another embodiment of the pressure plate, other parts, for example a middle part or the upper part, of the main body of the pressure plate may be also made from the first material having the first elastic material. Alternatively, in the embodiment of the pressure plate as shown in FIG. 3B, the whole protrusion body 111 is made from the first material having the first elastic material such that the protrusion body 111 in contact with the substrate 10 serves the function of pressure buffering. Also alternatively, in the embodiment of the pressure plate as shown in FIG. 3C, only an end region 1111 of the protrusion body 111, that is, a region that is in contact with the substrate 10, is made from the first material having the first elastic material such that the end region 1111 of the protrusion body 111 serves the function of pressure buffering. In another embodiment, an end of the protrusion body in the pressure plate connected with the main body of the pressure plate is made from the first material having the first elastic material. Embodiments of the pressure plate as exemplified above may be also combined. For example, as shown in FIG. 3D, both the middle part 1103 of the main body and the end region 1111 of the protrusion body 111 are made from the first material having the first elastic material, such that the main body 110 and the end region 1111 of the protrusion body 111 serve the function of pressure buffering, respectively.

Figure 3E:
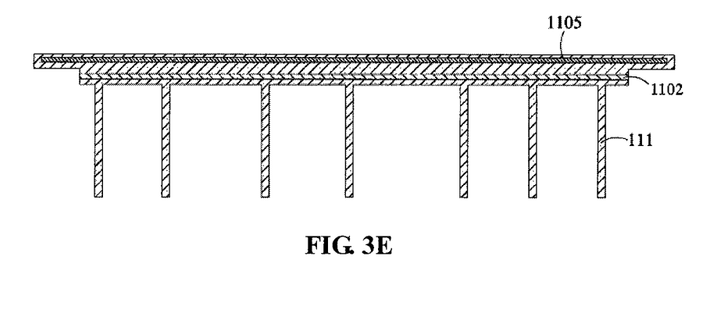
Figure 3F:
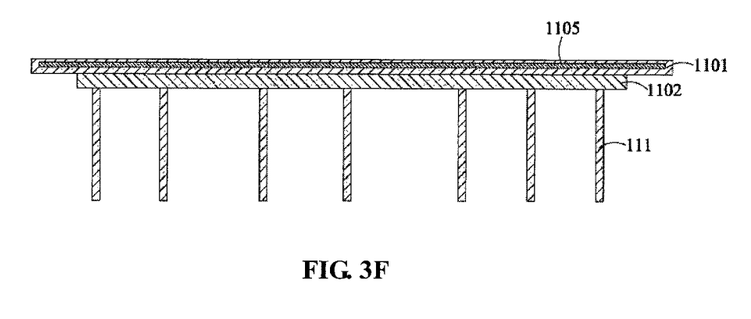

For purpose of further improving strength of the main body, the pressure plate may be additionally provided therein with a reinforcing rib. In an embodiment, the reinforcing rib is made from metallic materials, but not limited thereto. An embodiment of the additional reinforcing rib is as shown in FIG. 3E, a metallic reinforcing rib 1105 is additionally provided in the main body 110 of the pressure plate. As a thickness of the pressure plate 11 is limited and reinforcing function may be not available with a too small thickness of the metallic reinforcing rib 1105, the thickness of the metallic reinforcing rib 1105 can be selected as about 1 mm to about 2 mm. In the embodiment, the main body 110 serves the function of pressure buffering. Moreover, in addition to the function of reinforcing the structural strength, the metallic reinforcing rib can also serve as a shielding layer for the power circuit module. Another embodiment of the additional reinforcing rib is as shown in FIG. 3F, a metallic reinforcing rib 1105 is provided in the middle of the upper part 1101 of the main body 110, and the lower part 1102 of the main body 110 is made from the first material having the first elastic material, such that the main body 110 can be achieved with a certain degree of strength and serves to buffer pressure at the same time. The various structures exemplified above are only for purpose of illustration, but the present disclosure is not limited thereto. Any structure or material that enables the function of pressure buffering for the pressure plate should be covered by the protection scope of the present disclosure.

Figure 4:
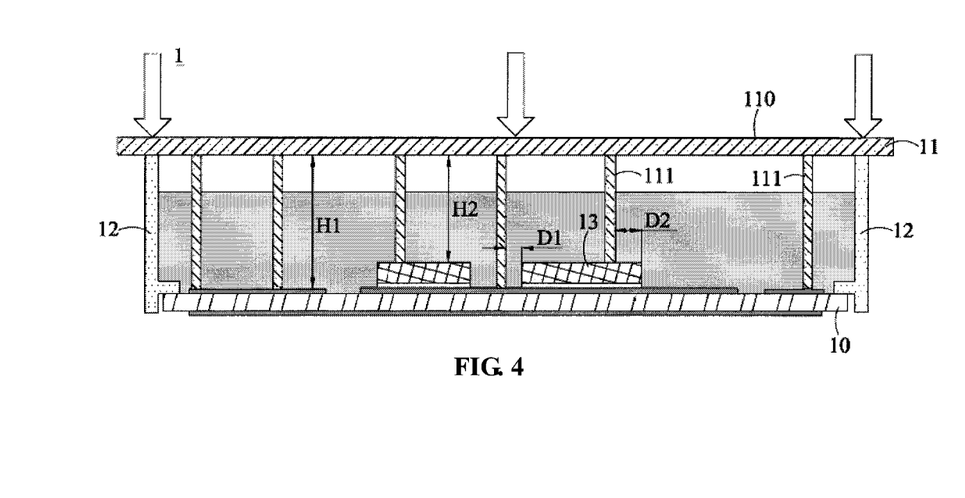
FIG. 4 is a schematic diagram illustrating pressure on a substrate by the pressure plate in the power circuit module according to embodiments of the disclosure.

FIG. 4 is a schematic diagram illustrating application of pressure on a substrate by the pressure plate in the power circuit module according to embodiments of the disclosure. In the embodiment as shown in FIG. 4, some protrusion bodies 111 of the pressure plate 11 are in contact with the surface of the substrate 10, while other protrusion bodies are in insulation contact with the power switching device 13 or other types of devices on the substrate. A distance D1 between the protrusion body 111 and an edge of the power switching device 13 and a distance D2 between the protrusion body 111 and an edge of another type of chip are required to be greater than 0.5 mm, so as to avoid stress concentration at the edge of the power switching device 13 or other types of devices. In an embodiment, as an actual design for arrangement of the protrusion bodies, direct contact with devices on the substrate should be avoided for the best as long as the protrusion bodies can be distributed on the substrate as evenly as possible. When it is unable to change arrangement of position for the devices on the substrate, however, a few protrusion bodies can be brought into contact with surfaces of devices on the substrate.

Further referring to FIG. 4, calculation of a thickness for the first material having the first elastic modulus is illustrated as an example where the main body 110 of the pressure plate 11 is made from the second material having the second elastic material and the protrusion body 111 is made from the first material having the first elastic modulus. In the embodiment as shown in FIG. 4, a height of the protrusion body 111 is calculated.

When pressure is applied on the pressure plate 11, the thickness of the first material having the first elastic modulus depends on factors such as pressure force required for a flat surface of deformed substrate, the elastic modulus of the first material, and restriction of the frame 12. It is assumed that the elastic modulus of the first material is far less than that of the second material. Thus, it can be approximately assumed that all elastic deformation occurs in the first material having the first elastic modulus. In an embodiment, the height of the protrusion body 111 can be designed based on following equation.

$$H = A*E*\Delta H/F$$

Herein, F is the pressure force applied on the substrate 10 by the pressure plate 11 to ensure a flat surface of deformed substrate 10, having a unit of N (Newton);

A is a cross sectional area of the protrusion body 111 along the direction of the pressure force, having a unit of $m^2$ (square meter);

E is the elastic modulus of the first material, having a unit of Pa (Pascal);

$\Delta H$ is a height of elastic deformation for the first material, having a unit of m (meter); and H is the height of the protrusion body 111, that is, H1 or H2 as shown in FIG. 4, having a unit of m (meter).

In the embodiment as shown in FIG. 4, the thickness of the first material having the first elastic modulus, that is, the height of the protrusion body 111, can be calculated based on the above equation since the first material is only used in the protrusion body 111. In other embodiments as shown in FIGS. 3A and 3C-3F, however, the thickness of the first material having the first elastic modulus can be derived through simulation or experiments as long as the height of elastic deformation for the first material, $\Delta H$, is at least more than an initial warpage value (typically from about 50 um to about 1 mm) of the substrate 10 in process of assembly.

For example, in order to ensure that various tolerances in manufacturing process can be absorbed by the first material having the first elastic modulus, the height H of the first material is generally set as at least twice the height $\Delta H$ of elastic deformation for the first material. As in the embodiment, when the initial warpage value of the substrate 10 (the height of elastic deformation for the first material is at least no less than it) is 0.3 mm, the corresponding height H of the first material is preferably above about 0.6 mm, for example, about 1 mm to 2 mm. Moreover, the value of H also depends on the value of the pressure force F applied on the substrate by the pressure plate, which is required to ensure a flat surface of deformed substrate and is determined by the pressure stress required to be endured by the substrate. Typically, there should be provided with a TIM (Thermal Interface Material) layer between the substrate 10 of the power circuit module 1 and the heat radiator 3 so as to reduce interface thermal resistance therebetween. Thermal dissipation capability of the TIM is related to the endured pressure stress and the larger the pressure stress is, the greater the thermal dissipation capability is. A typical level of the pressure stress may be ranged from 5 PSI to 40 PSI, and the value of F is defined by a product of the pressure stress and an area of the substrate. Therefore, in addition to absorption of initial deformation of the substrate, an extra height for providing the force F should be taken into account for calculating the value of H. For an example where a height of the power circuit module is 30 mm, the extra height may be about 1 mm to about 4 mm. As can be seen from above, the value of H ranges from about 2 mm to about 6 mm. In consideration of height consistency for the power circuit module, a distance control member (not illustrated in the drawing) can be formed between the pressure plate and the heat radiator with a rigid casing, such that the height consistency of the module can be adjusted.

Figure 5:
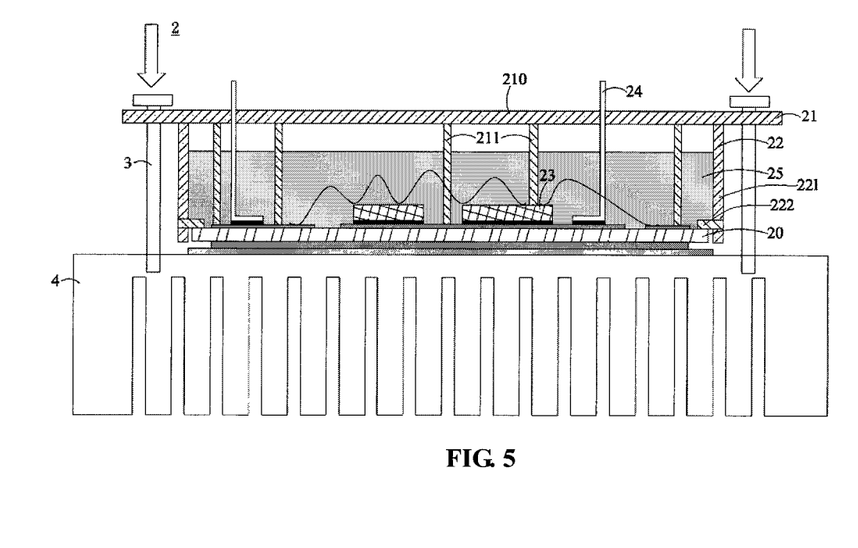
FIG. 5 is a schematic diagram illustrating a power circuit module according to another embodiment of the disclosure.

FIG. 5 is a schematic diagram illustrating a power circuit module according to another embodiment of the disclosure. In the power circuit module 1 as shown in FIG. 1, the pressure plate 11 and the frame 12 are individual members and formed together into a housing by assembly. In the embodiment as shown in FIG. 5, however, unlike the power circuit module 1 as shown in FIG. 1, the pressure plate 21 and the frame 22 of the power circuit module 2 are molded in one piece and can be manufactured by double-shot or multi-shot injection molding process. When the housing is formed by molding in one piece, as the pressure plate 21 is subject to significant compressive deformation due to pre-tightening force of the fastening part, the frame 22 is also subject to the compressive deformation, which will impact the enclosed cavity formed by the frame 22 and the substrate 20. Accordingly, in addition to the first material having the first elastic modulus introduced in the pressure plate 21 (FIG. 5 illustrates an example where the protrusion body 211 is made from the first material), the first material can be also added in the frame 22, for example, into the limiting part 222 and partially into the supporting art 221 as shown in FIG. 5, to absorb the compressive deformation of the frame 22. Thus, the frame 22 with the first material having the first elastic modulus will have less impact on the enclosed cavity formed by the frame 22 and the substrate 20. Moreover, power switching device 23, electrically connecting terminals 24, encapsulation material 25, and main body 210 as shown in FIG. 5 are similar to the power switching device 13, the electrically connecting terminals 14, the encapsulation material 15, and the main body 110 as shown in FIG. 1A and, thus, description thereof is not elaborated herein.

According to the power circuit module provided by the present disclosure, as pressure is applied on the pressure plate, the pressure transmitted to the substrate via the protrusion body of the pressure plate can be distributed more evenly due to buffering deformation of materials with different elastic modulus inside the pressure plate. In this way, risk for damage of the substrate due to concentrate stress can be reduced, assembly process of the power circuit module can be simplified, efficiency of the assembly can be improved, and structural cost of the power circuit module can be lowered.

What is mentioned above concretely illustrated and describes exemplary embodiments of the present disclosure. Nevertheless, it should be understood that the present disclosure is not limited to the embodiments disclosed herein. On the contrary, the present disclosure is intended to cover various modifications and equivalent arrangements within the spirit and scope of the appended claims.

What is claimed is:

1. A power circuit module, comprising:
   a pressure plate comprising a protrusion body and a main body;
   a frame; and
   a substrate bearing a power circuit, the power circuit comprising at least a power switching device;
   wherein the frame is disposed between the substrate and the pressure plate, the frame supports the pressure plate, and a substantially closed space is formed by the substrate, the pressure plate and the frame;
   when an external force is applied on the pressure plate, the protrusion body press against the substrate and is in insulation contact with the substrate, and the external force is transmitted to the substrate via the protrusion body;
   wherein the main body comprises a middle part and a remaining part other than the middle part, the middle part is made from a first material having a first elastic modulus and surrounded by the remaining part, the remaining part is made from a second material having a second elastic modulus;
   the protrusion body comprises an end region being in contact with the substrate and a remaining region other than the end region, the end region is made from the first material, the remaining region is made from the second material; and
   the second elastic modulus is more than twice the first elastic modulus.

2. The module of claim 1, wherein the protrusion body is perpendicular to the main body and located at one side of the main body toward the substrate.

3. The module of claim 2, further comprising a metallic reinforcing rib, the metallic reinforcing rib is provided at the main body.

4. The module of claim 2, wherein the substrate is provided thereon with a terminal, the main body is provided with a terminal hole for passing through the terminal, and the module is electrically coupled with an external system board via the terminal passing through the main body.

5. The module of claim 1, wherein the first elastic modulus of the first material is less than 500 Mpa.

6. The module of claim 1, wherein the pressure plate is molded in one piece.

7. The module of claim 1, wherein both the first material and the second material are thermoplastic insulated.

8. The module of claim 1, wherein a heat radiator is disposed at a surface of the substrate opposite to the power switching device.

9. The module of claim 8, wherein an end of the frame is connected with the pressure plate and another end of the frame is connected with the heat radiator.

10. The module of claim 9, wherein the frame comprises a supporting part and a limiting part, the supporting part surrounds the pressure plate and supports the substrate, and the limiting part restricts movement of the substrate.

11. The module of claim 10, wherein the limiting part is perpendicular to the supporting part, and the limiting part is clipped on a surface bearing the power switching device of the substrate.

12. The module of claim 9, wherein the pressure plate and the frame are molded in one piece.

13. The module of claim 9, further comprising a fastening part connecting the pressure plate with the heat radiator.

14. The module of claim 1, wherein a power of the power circuit is no less than 50 kilowatt.

15. The module of claim 1, wherein the substantially closed space is filled with encapsulation material covering the power switching device on the substrate.

* * * * *